(12) United States Patent
Chou et al.

(10) Patent No.: US 8,232,603 B2
(45) Date of Patent: Jul. 31, 2012

(54) GATED DIODE STRUCTURE AND METHOD INCLUDING RELAXED LINER

(75) Inventors: Anthony I. Chou, Hopewell Jct., NY (US); Gregory G. Freeman, Hopewell Jct., NY (US); Kevin McStay, Hopewell Jct., NY (US); Shreesh Narasimha, Hopewell Jct., NY (US)

(73) Assignee: International Business Machines Corporation, Armonk, NY (US)

( * ) Notice: Subject to any disclaimer, the term of this patent is extended or adjusted under 35 U.S.C. 154(b) by 243 days.

(21) Appl. No.: 12/702,380

(22) Filed: Feb. 9, 2010

(65) Prior Publication Data

US 2010/0237421 A1    Sep. 23, 2010

Related U.S. Application Data

(60) Provisional application No. 61/161,448, filed on Mar. 19, 2009.

(51) Int. Cl.
*H01L 21/70* (2006.01)

(52) U.S. Cl. ......... 257/368; 257/E27.016; 257/E21.532; 257/344; 257/351; 438/151; 438/166; 438/163; 438/268

(58) Field of Classification Search .......... 257/368, 257/E27.016, E21.532, 577, 344–351; 438/237, 438/151, 166, 163, 150, 268
See application file for complete search history.

(56) References Cited

U.S. PATENT DOCUMENTS

| | | | |
|---|---|---|---|
| 3,978,509 A | 8/1976 | Gouin et al. | |
| 4,199,773 A * | 4/1980 | Goodman et al. | 257/351 |
| 4,243,865 A | 1/1981 | Saxena | |
| 5,648,668 A * | 7/1997 | Kasai | 257/280 |
| 6,049,109 A * | 4/2000 | Omura et al. | 257/347 |
| 6,504,218 B1 * | 1/2003 | Kadosh et al. | 257/369 |
| 6,521,952 B1 * | 2/2003 | Ker et al. | 257/360 |
| 6,617,643 B1 | 9/2003 | Goodwin-Johansson | |
| 6,660,616 B2 * | 12/2003 | Babcock et al. | 438/479 |
| 6,737,708 B2 * | 5/2004 | Zhang et al. | 257/355 |
| 6,835,982 B2 * | 12/2004 | Hogyoku | 257/347 |
| 7,075,122 B1 * | 7/2006 | Yang et al. | 257/163 |
| 7,109,532 B1 * | 9/2006 | Lee et al. | 257/133 |
| 7,109,962 B2 * | 9/2006 | Takeuchi et al. | 345/92 |
| 7,145,209 B2 * | 12/2006 | Chang et al. | 257/408 |
| 7,232,730 B2 * | 6/2007 | Chen et al. | 438/301 |
| 7,238,963 B2 * | 7/2007 | Chang et al. | 257/57 |
| 7,301,202 B2 * | 11/2007 | Kouzuki et al. | 257/335 |
| 7,453,122 B2 * | 11/2008 | Huang | 257/347 |

(Continued)

OTHER PUBLICATIONS

European Search Report, Nov. 11, 2009.

*Primary Examiner* — N Drew Richards
*Assistant Examiner* — Ankush Singal
(74) *Attorney, Agent, or Firm* — Scully, Scott, Murphy & Presser, P.C.; H. Daniel Schnurmann

(57) ABSTRACT

A gated diode structure and a method for fabricating the gated diode structure use a relaxed liner that is derived from a stressed liner that is typically used within the context of a field effect transistor formed simultaneously with the gated diode structure. The relaxed liner is formed incident to treatment, such as ion implantation treatment, of the stressed liner. The relaxed liner provides improved gated diode ideality in comparison with the stressed liner, absent any gated diode damage that may occur incident to stripping the stressed liner from the gated diode structure while using a reactive ion etch method.

20 Claims, 8 Drawing Sheets

U.S. PATENT DOCUMENTS

| | | | |
|---|---|---|---|
| 7,663,189 B2* | 2/2010 | Fukuda | 257/352 |
| 7,821,807 B2* | 10/2010 | Velicu et al. | 365/115 |
| 7,859,009 B1* | 12/2010 | Kerr et al. | 257/107 |
| 7,952,145 B2* | 5/2011 | Korec et al. | 257/343 |
| 7,989,889 B1* | 8/2011 | Kerr et al. | 257/339 |
| 2002/0033520 A1* | 3/2002 | Kunikiyo | 257/577 |
| 2002/0050614 A1* | 5/2002 | Unnikrishnan | 257/347 |
| 2002/0140009 A1* | 10/2002 | Lee et al. | 257/291 |
| 2002/0167020 A1* | 11/2002 | Iwamoto et al. | 257/110 |
| 2002/0197776 A1* | 12/2002 | Zhang et al. | 438/149 |
| 2003/0132450 A1* | 7/2003 | Minato et al. | 257/110 |
| 2003/0162336 A1* | 8/2003 | Wei et al. | 438/166 |
| 2004/0065921 A1* | 4/2004 | Iwamoto et al. | 257/341 |
| 2005/0006699 A1* | 1/2005 | Sato et al. | 257/327 |
| 2005/0179079 A1* | 8/2005 | Wu | 257/316 |
| 2005/0186722 A1 | 8/2005 | Cheng et al. | |
| 2005/0189589 A1* | 9/2005 | Zhu et al. | 257/347 |
| 2005/0212048 A1* | 9/2005 | Litwin | 257/350 |
| 2005/0263825 A1 | 12/2005 | Frohberg et al. | |
| 2006/0027864 A1* | 2/2006 | Negoro et al. | 257/335 |
| 2006/0125028 A1* | 6/2006 | Chen et al. | 257/410 |
| 2006/0194392 A1* | 8/2006 | Nagaoka | 438/268 |
| 2006/0246672 A1* | 11/2006 | Chen et al. | 438/301 |
| 2007/0075367 A1* | 4/2007 | Boguszewics et al. | 257/347 |
| 2007/0114627 A1* | 5/2007 | Roy et al. | 257/431 |
| 2007/0178650 A1* | 8/2007 | Chen et al. | 438/301 |
| 2007/0218579 A1* | 9/2007 | Lee et al. | 438/48 |
| 2007/0246741 A1* | 10/2007 | Sudo | 257/178 |
| 2007/0262386 A1* | 11/2007 | Gossner et al. | 257/355 |
| 2007/0278568 A1* | 12/2007 | Williams et al. | 257/335 |
| 2008/0121807 A1* | 5/2008 | Valvo et al. | 250/370.07 |
| 2008/0135873 A1* | 6/2008 | Fiorenza et al. | 257/190 |
| 2008/0179690 A1 | 7/2008 | Takeoka | |
| 2008/0197411 A1* | 8/2008 | Korec et al. | 257/343 |
| 2008/0230834 A1* | 9/2008 | Akagi et al. | 257/337 |
| 2008/0311717 A1* | 12/2008 | Bulucea | 438/290 |
| 2009/0026491 A1* | 1/2009 | Booth et al. | 257/105 |
| 2009/0162979 A1* | 6/2009 | Yang et al. | 438/136 |
| 2009/0166757 A1* | 7/2009 | Baiocco et al. | 257/393 |
| 2009/0179298 A1* | 7/2009 | Cheng | 257/506 |
| 2009/0243049 A1* | 10/2009 | Frohberg et al. | 257/635 |
| 2010/0244148 A1* | 9/2010 | Chaparala et al. | 257/408 |

* cited by examiner

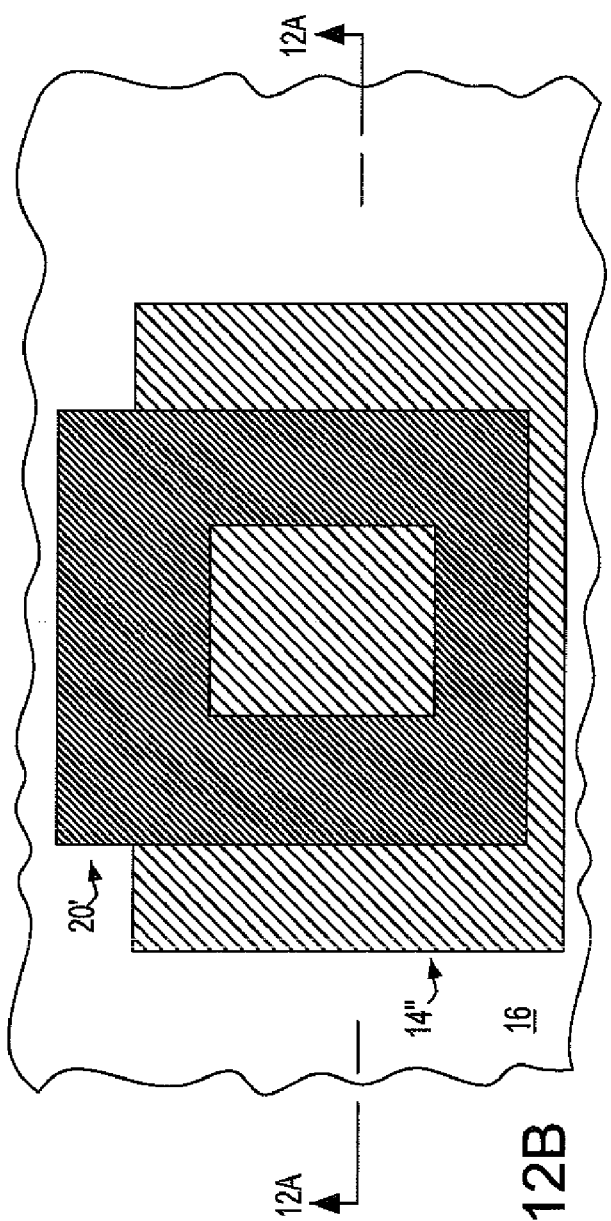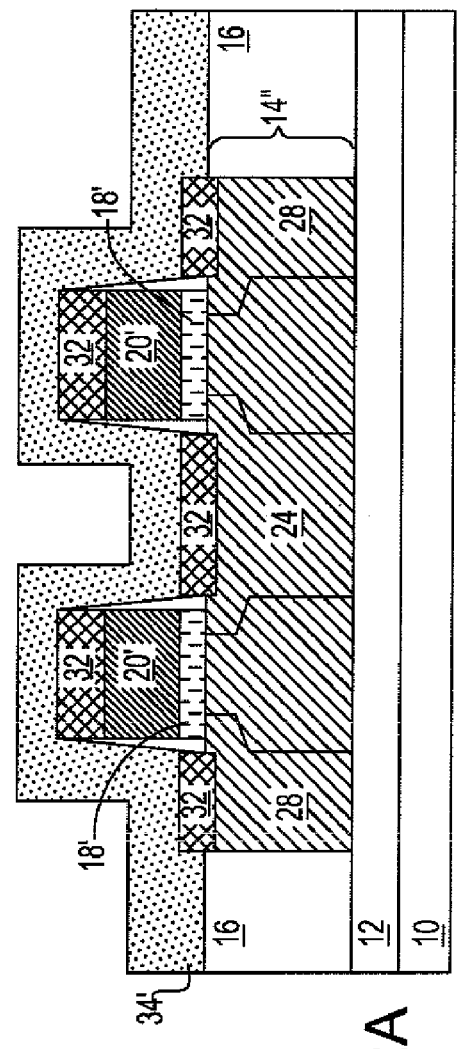
FIG. 12B
FIG. 12A

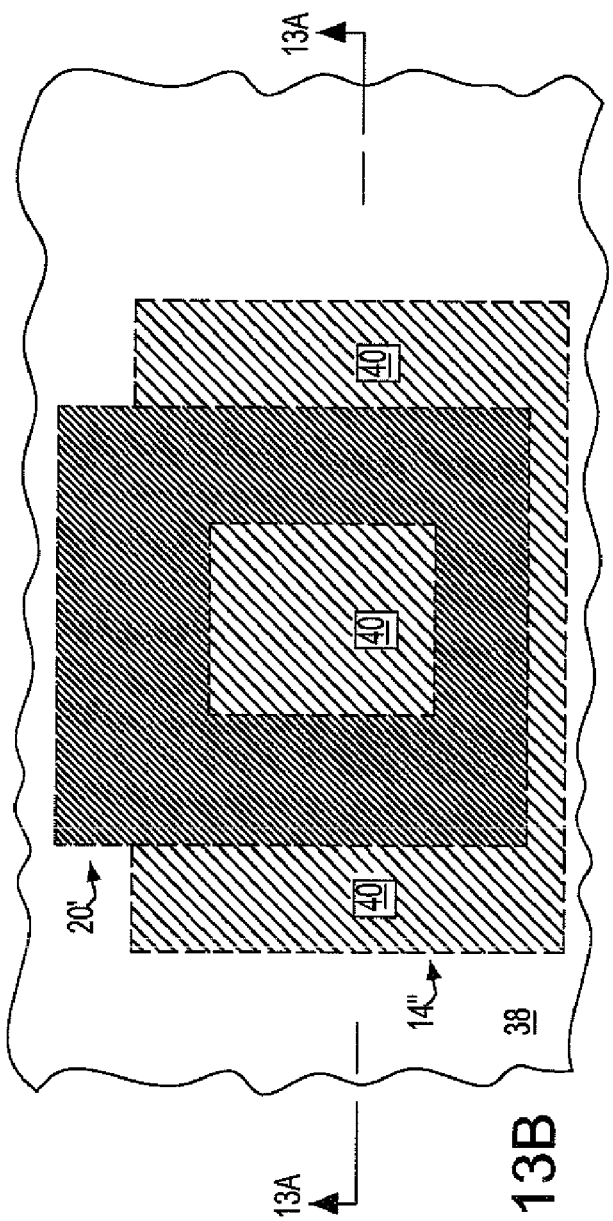
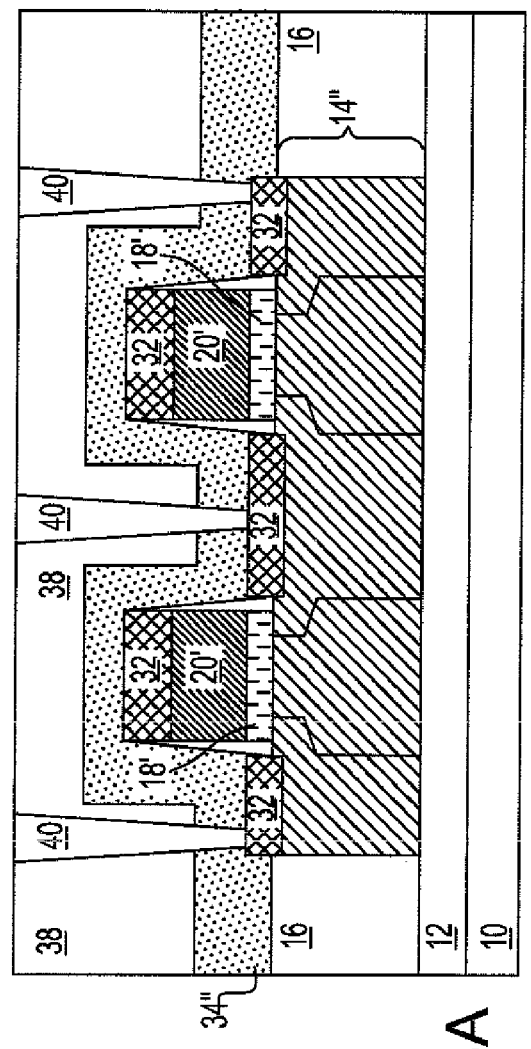
FIG. 13B
FIG. 13A

GATED DIODE STRUCTURE AND METHOD INCLUDING RELAXED LINER

This non-provisional application claims the benefit of the provisional application filed with the United States Patent and Trademark Office as Ser. No. 61/161,558 entitled "Gate Diode Structure and Method Including Relaxed Liner", filed Mar. 19, 2009.

BACKGROUND

1. Field of the Invention

The invention relates generally to gated diode structures within semiconductor structures. More particularly, the invention relates to gated diode structures including relaxed liners within semiconductor structures.

2. Description of the Related Art

In addition to resistors, capacitors and transistors, semiconductor structures and semiconductor circuits often also include diodes. Diodes within semiconductor structures and semiconductor circuits are desirable and functional within the context of any of several signal processing applications, as well as temperature sensing and stress sensing applications, and further as well as electrostatic protection applications.

A particular type of diode structure that is desirable and common within semiconductor fabrication technology is a gated diode structure. A gated diode structure is otherwise generally analogous in structure and dimensions with a field effect transistor structure, but differs insofar as the source and drain regions within a gated diode structure have different polarities (i.e., conductivity type). Gated diode structures are thus clearly desirable insofar as they are readily manufacturable within the context of semiconductor manufacturing technologies that are used for fabricating field effect transistor structures.

While gated diode structures are thus desirable within the semiconductor fabrication art, gated diode structures are nonetheless not entirely without problems within the context of semiconductor fabrication. In particular, gated diode structures, while possessing advantages derived from their simultaneous fabrication with field effect transistor structures nonetheless also suffer from any of several disadvantages that may also be realized incident to being fabricated simultaneously with field effect transistor structures.

Various diode structures, including gated diode structures, and methods for fabrication thereof, are known in the semiconductor fabrication art.

For example, Adams et al., in U.S. Pat. No. 6,441,396, teaches a semiconductor structure including a diode structure, and a method for fabricating the semiconductor structure that includes the diode structure. Within both the semiconductor structure and the method, the diode structure is used as a stress monitoring structure for other semiconductor structures near to the diode structure.

In addition, Maciejewski et al., in U.S. Pat. No. 7,227,204, teaches a diode structure having enhanced ideality, and a method for fabricating the diode structure having the enhanced ideality. The diode structure realizes the foregoing result by including an anode that includes separate regions that include an alloyed semiconductor material and an unalloyed semiconductor material.

Diode structures, such as in particular gated diode structures, are certain to continue to be useful within semiconductor structure and semiconductor device fabrication art as semiconductor structure fabrication requirements and semiconductor device fabrication requirements become more stringent. To that end, desirable are diode structures, and methods for fabricating those diode structures, that provide the diode structures with improved properties and enhanced performance.

SUMMARY

The invention provides a gated diode structure for use within a semiconductor structure, as well as a method for fabricating the gated diode structure for use within the semiconductor structure. Within the invention, both the gated diode structure and the method for fabricating the gated diode structure include a relaxed liner located upon a gate and diode electrode regions within the gated diode structure. Within the inventive method, the relaxed liner derives from a stressed liner that is otherwise used within a field effect transistor fabricated simultaneously with the gated diode structure, but wherein the portion of the stressed liner that covers the gated diode structure is treated (i.e., most preferably using an ion implantation treatment) to relax (i.e., release or reduce), and preferably eliminate, the stress within the portion of the stressed liner layer that is included within the gated diode structure. The fabrication of such a relaxed liner from a stressed liner within a gated diode structure is desirable insofar as the relaxed liner improves ideality performance of a gated diode structure in comparison, in particular, with a tensile stressed liner. Similarly, by leaving the stressed liner in place within a gated diode structure and fabricating the relaxed liner therefrom in-situ i.e., rather than stripping the stressed liner while using an etch method, an improved ideality performance of a gated diode may be effected absent gated diode performance degradation that may otherwise be realized under circumstances where a stressed liner is completely stripped from a gated diode structure while using, in particular, a reactive ion etch method.

Within the invention, a "stressed liner" is intended as having a stress in excess of about 0.3 GPa tensile or in excess of about –0.3 GPa compressive. A "relaxed liner" is intended as having a stress no greater than about +/–0.3 GPa tensile or compressive.

A particular gated diode structure in accordance with the invention includes a semiconductor substrate including a (comparatively) lightly doped region of a first polarity separating a (comparatively) heavily doped region of the first polarity from a (comparatively) heavily doped region of a second polarity different than the first polarity. This particular gated diode structure also includes a gate aligned above the (comparatively) lightly doped region of the first polarity. This particular gated diode structure also includes a relaxed liner located conformally covering the gate and the semiconductor substrate.

Another particular gated diode structure in accordance with the invention includes a semiconductor substrate including a (comparatively) lightly doped region of a first polarity separating a (comparatively) heavily doped region of the first polarity from a (comparatively) heavily doped region of a second polarity different than the first polarity. This other particular gated diode structure also includes a gate aligned above the (comparatively) lightly doped region of the first polarity. This other particular gated diode structure also includes a relaxed liner located conformally covering the gate and the semiconductor substrate. The relaxed liner includes a silicon nitride material that includes an impurity selected from the group consisting of germanium impurities and xenon impurities.

A particular method for fabricating a gated diode structure in accordance with the invention includes forming over a semiconductor substrate a gate. This particular method also includes forming within the semiconductor substrate a (comparatively) lightly doped region of a first polarity aligned beneath the gate and laterally separating a (comparatively) heavily doped region of the first polarity from a (comparatively) heavily doped region of a second polarity different than the first polarity. This particular method also includes forming a stressed liner conformally covering the gate and the semiconductor substrate. This particular method also includes treating the stressed liner to form a relaxed liner.

Within the foregoing gated diode structures and method, and in accordance with disclosure below, a (comparatively) lightly doped region has a dopant concentration from 1e12 to about 1e17 dopant atoms per cubic centimeter, while a (comparatively) heavily doped region has a dopant concentration from 1e17 to about 1e21 dopant atoms per cubic centimeter.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein:

FIG. 1 to FIG. 13B show a series of schematic cross-sectional and plan-view diagrams illustrating the results of progressive fabrication process steps in forming a gated diode structure in accordance with an embodiment of the invention.

FIG. 1 shows a semiconductor-on-insulator substrate base substrate fabrication with respect to the gated diode structure.

FIG. 2 shows isolation region fabrication with respect to FIG. 1.

FIG. 3 shows ion implantation processing with respect to FIG. 2.

FIG. 4 shows gate masking with respect to FIG. 3.

FIG. 5 shows gate etching with respect to FIG. 4.

FIG. 6 shows partial gate masking and diode electrode formation with respect to FIG. 5.

FIG. 7 shows further partial gate masking and additional diode electrode formation with respect to FIG. 6.

FIG. 8 shows spacer formation with respect to FIG. 7.

FIG. 9 shows silicide formation with respect to FIG. 8.

FIG. 10 shows liner formation with respect to FIG. 9.

FIG. 11 shows liner masking and implantation with respect to FIG. 10.

FIG. 12A/B shows resist stripping with respect to FIG. 11.

FIG. 13A/B shows passivation/contact formation with respect to FIG. 12A/B.

DESCRIPTION OF THE PREFERRED EMBODIMENT

The invention, which includes a gated diode structure and a method for fabricating the diode structure, is understood within the context of the description set forth below. The description set forth below is understood within the context of the drawings described above. Since the drawings are intended for illustrative purposes, the drawings are not necessarily drawn to scale.

Figure 1:
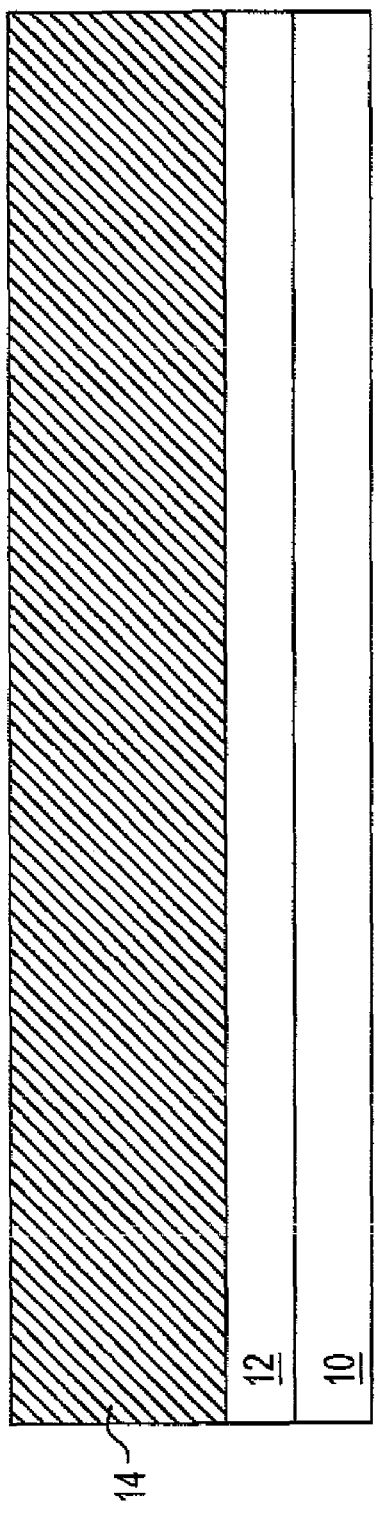

FIG. 1 to FIG. 13B show a series of schematic cross-sectional and plan-view diagrams of progressive stages in fabricating a gated diode structure in accordance with a particular embodiment of the invention. FIG. 1 shows a schematic cross-sectional diagram of the gated diode structure at an early stage in the fabrication thereof in accordance with this particular embodiment of the invention, that comprises a sole embodiment of the invention.

FIG. 1 shows a base semiconductor substrate 10. A buried dielectric layer 12 is located upon the base semiconductor substrate 10. A surface semiconductor layer 14 is located upon the buried dielectric layer 12. In an aggregate, the base semiconductor substrate 10, the buried dielectric layer 12 and the surface semiconductor layer 14 comprise a semiconductor-on-insulator substrate.

The base semiconductor substrate 10 may comprise any of several semiconductor materials. Non-limiting examples include silicon, germanium, silicon-germanium alloy, silicon carbide, silicon-germanium carbide alloy and compound (i.e., III-V and II-VI) semiconductor materials. Non-limiting examples of compound semiconductor materials include gallium arsenide, indium arsenide and indium phosphide semiconductor materials. Typically, the base semiconductor substrate 10 has a generally conventional thickness.

The buried dielectric layer 12 may comprise any of several dielectric materials. Non-limiting examples include oxides, nitrides and oxynitrides, particularly of silicon, but oxides, nitrides and oxynitrides of other elements are not excluded. The buried dielectric layer 12 may comprise a crystalline or a non-crystalline dielectric material. The buried dielectric layer 12 may be formed using any of several methods. Non-limiting examples include ion implantation methods, thermal or plasma oxidation or nitridation methods, chemical vapor deposition methods and physical vapor deposition methods. Typically, the buried dielectric layer 12 comprises an oxide of the semiconductor material from which is comprised the semiconductor substrate 10. Typically, the buried dielectric layer 12 has a thickness from about 5 to about 1000 nanometers.

The surface semiconductor layer 14 may comprise any of the several semiconductor materials from which the semiconductor substrate 10 may be comprised. The surface semiconductor layer 14 and the semiconductor substrate 10 may comprise either identical or different semiconductor materials with respect to chemical composition, dopant polarity, dopant concentration and crystallographic orientation. Typically, the surface semiconductor layer 14 has a thickness from about 50 to about 300 nanometers.

The semiconductor-on-insulator substrate that is illustrated in FIG. 1 may be fabricated using any of several methods. Non-limiting examples include lamination methods, layer transfer methods and separation by implantation of oxygen (SIMOX) methods.

Although this particular embodiment illustrates the invention within the context of a semiconductor-on-insulator substrate comprising the base semiconductor substrate 10, the buried dielectric layer 12 and the surface semiconductor layer 14, neither the embodiment more specifically, nor the invention more particularly, is so limited. Rather, the present invention may alternatively be practiced using a bulk semiconductor substrate (that would otherwise result from absence of the buried dielectric layer 12 under circumstances where the base semiconductor substrate 10 and the surface semiconductor layer 14 have identical chemical composition and crystallographic orientation). The embodiment also contemplates use of a hybrid orientation (HOT) substrate that includes multiple crystallographic orientation semiconductor regions within a single semiconductor substrate.

Figure 2:
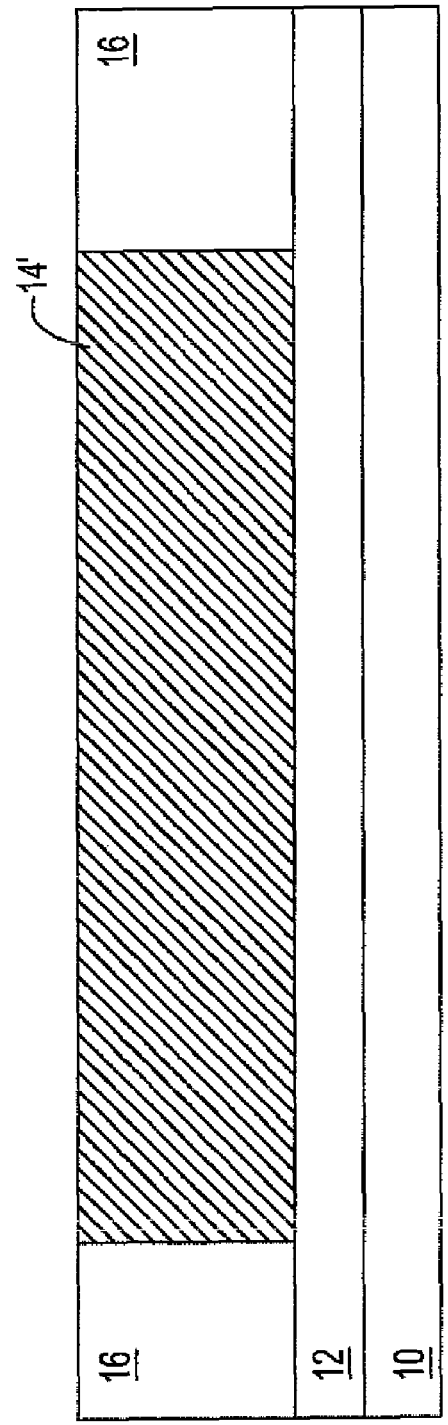

FIG. 2 first shows the results of patterning the surface semiconductor layer 14 that is illustrated in FIG. 1 to provide a surface semiconductor layer 14'. FIG. 2 also shows an isolation region 16 located backfilling and adjoining the surface semiconductor layer 14' and planarized to the level of the surface semiconductor layer 14'.

The surface semiconductor layer 14 may be patterned to form the surface semiconductor layer 14' while using photolithographic and etch methods that are otherwise generally conventional in the semiconductor fabrication art. Such photolithographic and etch methods will generally include anisotropic etch methods. Anisotropic etch methods are generally desirable in comparison with isotropic etch methods insofar as anisotropic etch methods provide generally straight sidewalls to the surface semiconductor layer 14'.

The isolation region 16 may in general comprise materials, and be formed using methods, analogous, equivalent or identical to the materials and methods that are used for forming the buried dielectric layer 12. Typically and preferably, the isolation region 16 is formed using a blanket layer deposition and planarizing method that uses the surface semiconductor layer 14' as a planarizing stop layer. Particular planarizing methods include mechanical planarizing methods and chemical mechanical polish planarizing methods. Chemical mechanical polish planarizing methods are most common.

While such etch, fill and planarization techniques are common to high-density silicon technologies, alternate lower cost techniques may also be used such as the commonly called ROX method, utilizing patterned overlayers and substrate oxidation. The detailed fabrication and structure of this isolation region is not critical to the invention, and such choice is to be made typically in concert with the integration of the contextual technology fabrication methods.

Figure 3:
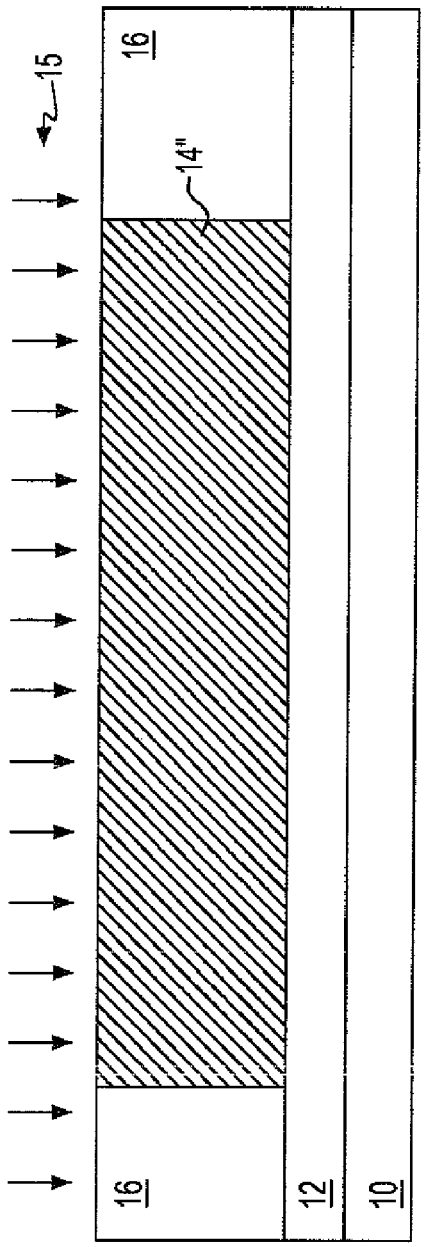

FIG. 3 shows the results of doping the surface semiconductor layer 14' to provide a surface semiconductor layer 14" while using a dose of dopant ions 15. The dose of dopant ions 15 typically comprises n dopant ions, such as arsenic or phosphorus dopant ions, although an operative gated diode structure in accordance with the embodiment may also result from p dopant ion implantation. Typically, the dose of dopant ions 15 is provided at an appropriate dose and energy to provide a dopant concentration within the surface semiconductor layer 14" from about 1e12 to about 1e14 n dopant atoms or p dopant atoms per cubic centimeter. Alternatively to the forgoing ion implantation of the surface semiconductor layer 14' to provide the surface semiconductor layer 14", the surface semiconductor layer 14 as initially formed may be formed as a doped surface semiconductor layer.

Figure 4:
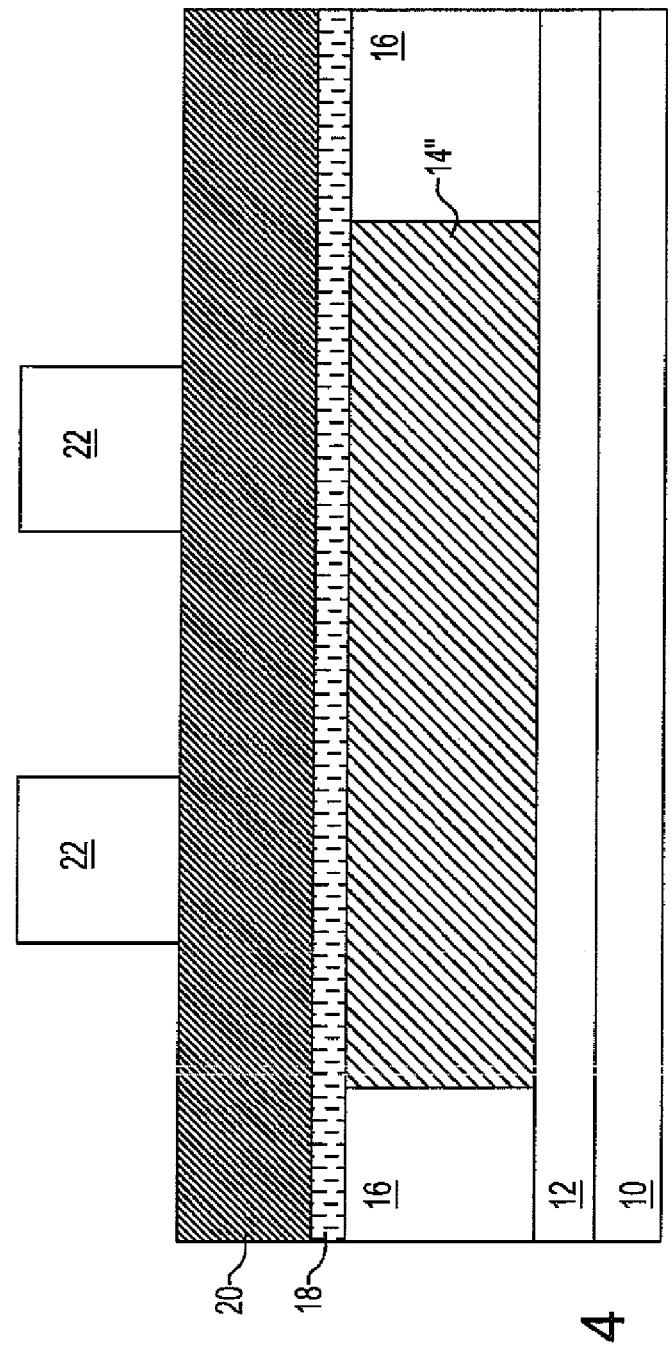

FIG. 4 shows a gate dielectric 18 located and formed upon the semiconductor structure of FIG. 3, including in particular the surface semiconductor layer 14" and the isolation region 16. Such formation that extends overtop both the surface semiconductor layer 14" and isolation region 16 would consist of a layer deposition rather than a self-aligned thermal oxidation formation. Alternatively, the extent of layer 18 may be limited to overtop layer 14" and not extending overtop layer 16, if the layer is a thermal oxidation. FIG. 4 also shows a gate material layer 20 located and formed upon the gate dielectric 18. FIG. 4 finally shows a first mask 22 (i.e., illustrated as plural layers in cross-section, but within the context of further disclosure below, including plan-view diagrams, intended as a single annular first mask 22) located and formed upon the gate material layer 20 at a location above the surface semiconductor layer 14".

The gate dielectric 18 may comprise conventional dielectric materials such as oxides, nitrides and oxynitrides of silicon that have a dielectric constant from about 4 to about 20, measured in vacuum. Alternatively, the gate dielectric 18 may comprise generally higher dielectric constant dielectric materials having a dielectric constant from about 20 to at least about 100. Such higher dielectric constant dielectric materials may include, but are not limited to hafnium oxides, hafnium silicates, titanium oxides, barium-strontium-titanates (BSTs) and lead-zirconate-titanates (PZTs). The gate dielectric 18 may be formed using any of several methods that are appropriate for the material of composition of the gate dielectric 18. Included, but not limiting, are thermal or plasma oxidation or nitridation methods, chemical vapor deposition methods and physical vapor deposition methods. Typically, the gate dielectric 18 comprises a thermal silicon oxide dielectric material or a high dielectric constant dielectric material, either of which has a generally conventional thickness.

The gate material layer 20 may comprise materials including, but not limited to certain metals, metal alloys, metal nitrides and metal silicides, as well as laminates thereof and composites thereof. The gate material layer 20 may also comprise doped polysilicon and doped polysilicon-germanium materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate material layer 20 comprises a doped polysilicon material that has a thickness from about 20 to about 200 nanometers.

The first mask 22, as well as other masks within the instant embodiment, may comprise any of several mask materials including but not limited to hard mask materials and resist mask materials. Typically, the first mask 22 comprises a resist mask material, such as a photoresist mask material. Such a resist mask material may include, but is not necessarily limited to a negative resist material, a positive resist material and a hybrid resist material that includes the properties of both a positive resist material and a negative resist material. Typically, the first mask 22 comprises a positive resist material or a negative resist material that has a thickness from about 100 to about 500 nanometers. In accordance with disclosure above, the first mask 22 is intended in plan-view as having an annular shape.

Figure 5:
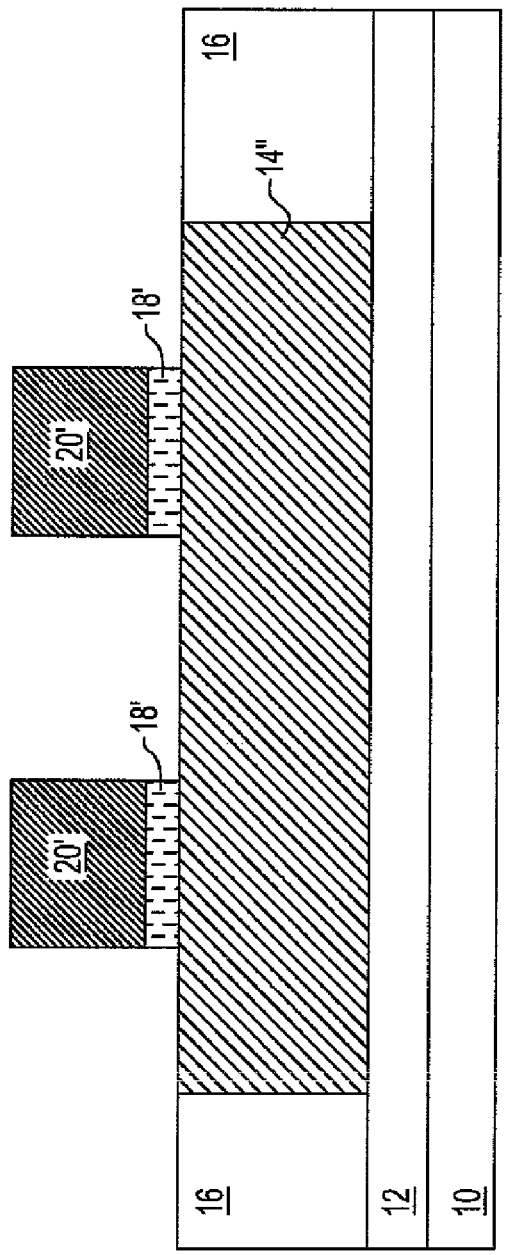

FIG. 5 first shows the results of patterning the gate material layer 20 to provide a gate 20' and the gate dielectric 18 to provide a gate dielectric 18', while using the first mask 22 as an etch mask. The foregoing patterning of the gate material layer 20 to provide the gate 20' and the gate dielectric 18 to provide the gate dielectric 18' (i.e., both of which are intended as annular layers) while using the first mask 22 as an etch mask may be effected using etch methods and etch materials that are otherwise generally conventional in the semiconductor fabrication art. Similarly with the etch methods that are used for forming the surface semiconductor layer 14' that is illustrated in FIG. 2 from the surface semiconductor layer 14 that is illustrated in FIG. 1, such etch methods will typically include anisotropic reactive ion etch methods that provide generally straight sidewalls to the gate 20' and the gate dielectric 18'.

FIG. 5 also shows the results of stripping the first mask 22 from the gate 20'. The first mask 22 may be stripped from the gate 20' while using methods and materials that are otherwise generally conventional in the semiconductor fabrication art. Such methods and materials may include, but are not necessarily limited to, wet chemical stripping methods and materials, dry plasma stripping methods and materials, and combinations of wet chemical stripping methods and materials and dry plasma stripping methods and materials.

Figure 6:
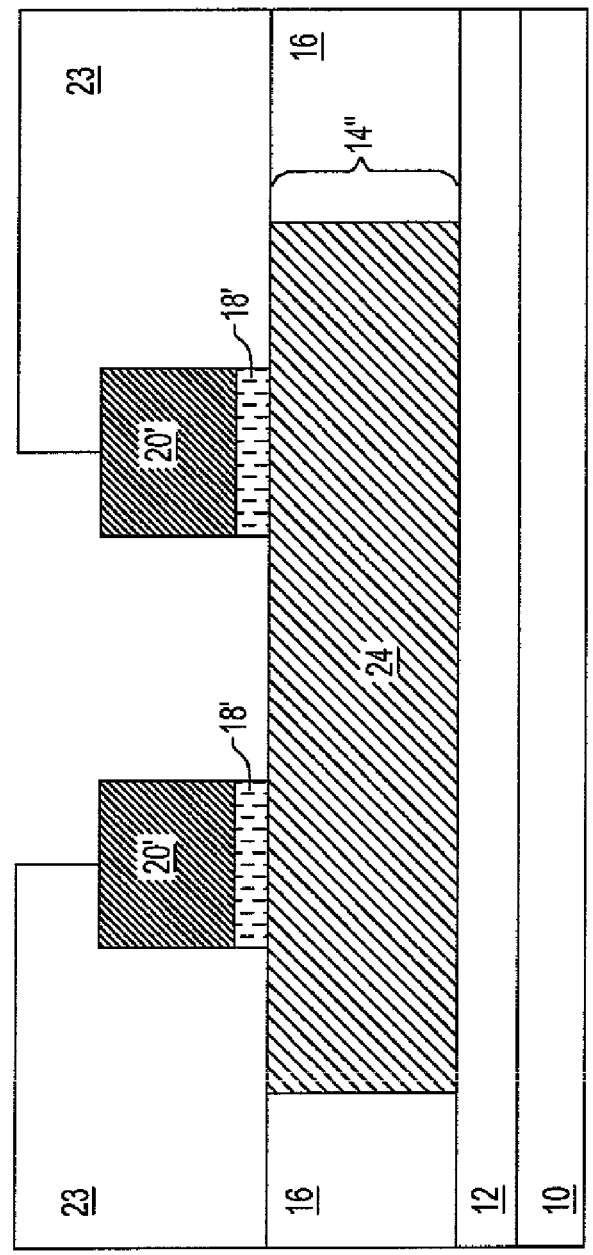

FIG. 6 first shows the results of masking external portions of the gate 20', and in particular adjacent portions of the surface semiconductor layer 14", with a second mask 23. The second mask 23 may comprise materials analogous, equivalent or identical to the first mask 20 that is illustrated in FIG. 4. Typically, the second mask 23 also comprises a positive resist material or a negative resist material. The second mask 23 is understood as a block mask whose lateral dimensions need not be critically dimensioned, providing that exterior portions of the gate 20' and adjacent portions of the surface semiconductor layer 14", are covered.

FIG. 6 also shows a first diode electrode 24 (i.e., an anode when p+ and a cathode when n+) located and formed interior to the gate 20' while using the gate 20' and the second mask 23 as an ion implantation mask. While the first diode electrode 24 may be of either polarity with respect to the surface semiconductor layer 14", typically the first diode electrode 24 has a polarity opposite the polarity of the other remaining portions of the surface semiconductor layer 14", although this is also not a requirement of the embodiment. Typically, the first diode electrode 24 has a dopant concentration from about 1e19 to about 1e21 p dopant atoms per cubic centimeter.

Figure 7:
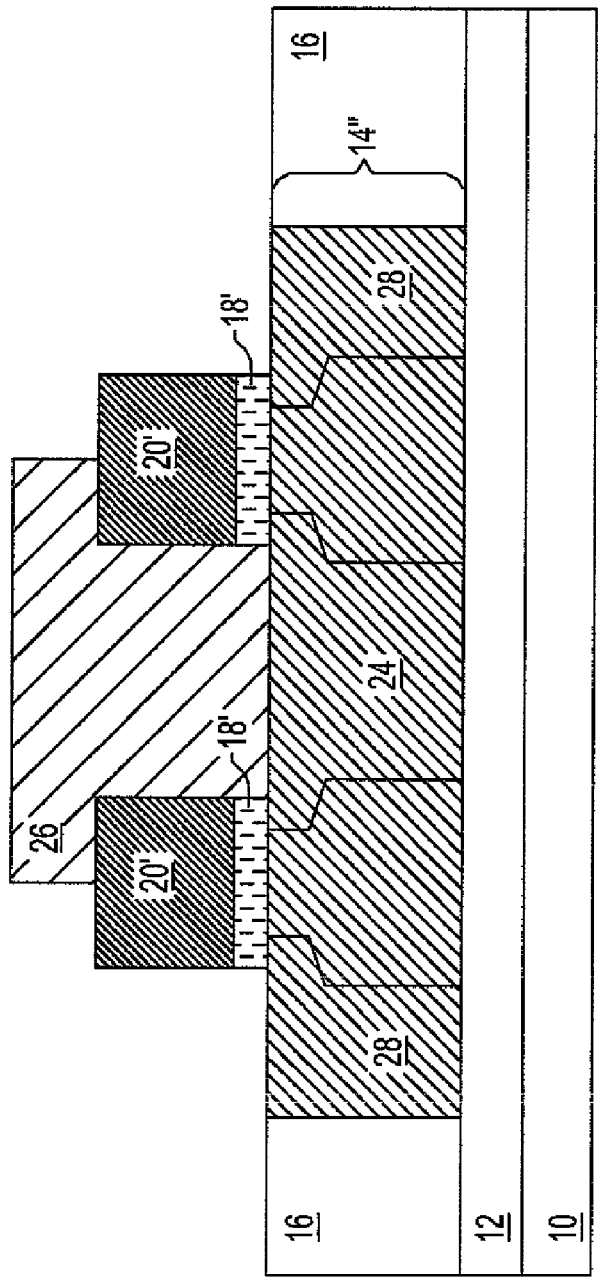

FIG. 7 first shows the results of stripping the second mask 23 from the gated diode structure of FIG. 6. The second mask 23 may be stripped from the gated diode structure of FIG. 6 to provide in-part the gated diode structure of FIG. 7 while using stripping methods and materials that are otherwise generally conventional in the semiconductor fabrication art. Again, and in general, such stripping methods and materials may include, but are not necessarily limited to, wet chemical stripping methods and materials, dry plasma striping methods and materials and combinations of wet chemical stripping methods and materials and dry plasma stripping methods and materials.

FIG. 7 next shows a third mask 26 located and formed covering the interior portion of the surface semiconductor layer 14" that includes the first diode electrode 24 that is surrounded by the gate 20'. The third mask 26 may comprise mask materials, and have dimensions, generally analogous, equivalent or identical to the mask materials and dimensions that are used for the second mask 23 that is illustrated in FIG. 6 and the first mask 22 that is illustrated in FIG. 4.

FIG. 7 also shows a second diode electrode 28 (i.e., the other of the anode (if p+) or cathode (if n+)) located and formed into the surface semiconductor layer 14" at portions thereof not covered by the gate 20' or the third mask 26. The second diode electrode 28 has a polarity different than the first diode electrode 24, while the second diode electrode 28 has a dopant concentration from about 1e19 to about 1e21 dopant atoms per cubic centimeter. Thus, a portion of the surface semiconductor layer 14" located aligned beneath the gate 20' has a particular polarity (i.e., preferably n−) and separates the first diode electrode 24 (i.e., preferably a p+ anode) and the second diode electrode 28 (i.e., preferably a n+ cathode) that are of different polarity and higher dopant concentration than the portion of the surface semiconductor layer 14" aligned beneath gate 20'.

Figure 8:
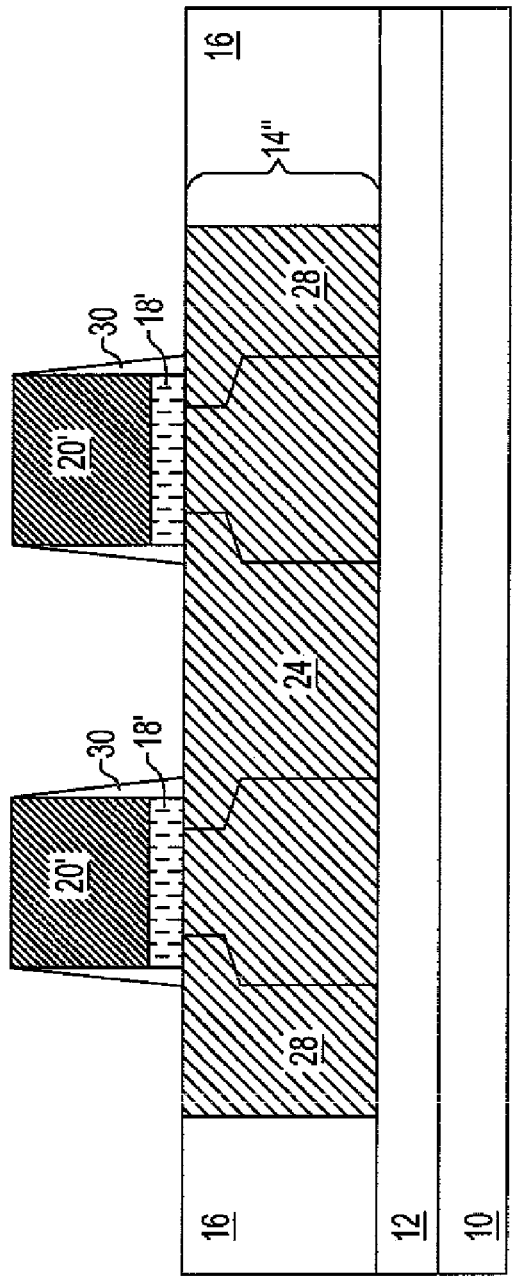

FIG. 8 first shows the results of stripping the third mask 26 from the semiconductor structure of FIG. 7. The third mask 26 may be stripped from the semiconductor structure of FIG. 7 to provide in-part the semiconductor structure of FIG. 8 while using stripping methods and materials that are otherwise generally conventional in the semiconductor fabrication art, and analogous, equivalent or identical to the stripping methods and materials that are used for stripping the second mask 23 that is illustrated in FIG. 6 or the first mask 22 that is illustrated in FIG. 4.

FIG. 8 also shows spacers 30 located adjacent and adjoining opposite sidewalls of the gate stack that comprises the gate 20' and the gate dielectric 18'. The spacers 30 may comprise materials, and be formed using methods, that are otherwise generally conventional in the semiconductor fabrication art. Typically, the spacers 30 comprise a dielectric material, such as but not limited to a silicon oxide dielectric material, a silicon nitride dielectric material or a silicon oxynitride dielectric material. Typically, the spacers 30 are formed using a blanket layer deposition and anisotropic etchback method.

Such spacers, while typically employed to optimize source and drain junction profiles in MOSFET devices by applying additional impants at this point, may also be used to optimize the dopant profiles of the gated diode of this particular embodiment. Such additional dopants may be applied in conjunction with masking regions similar to layers 23 and 26, but now with spacers 30 in place. The detail of such optimization is not shown here and left to those knowledgeable in state of the art to exercise.

Figure 9:
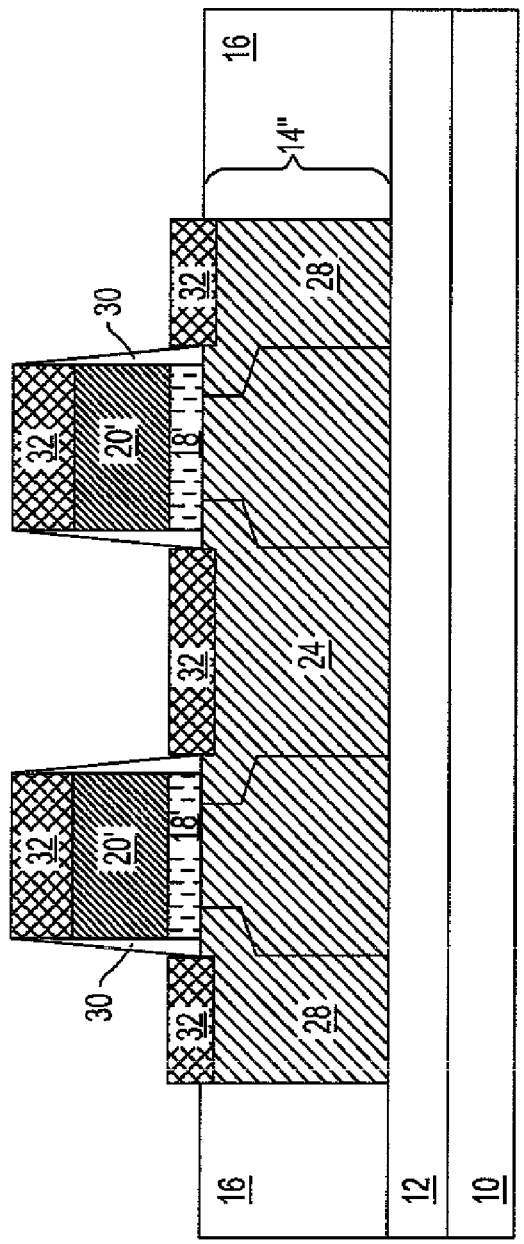

FIG. 9 shows silicide layers 32 located and formed upon exposed portions of the gate 20', the first diode electrode 24 and the second diode electrode 28. The silicide layers 32 may comprise any of several silicide forming metals. Non-limiting examples of candidate silicide forming metals include nickel, cobalt, titanium, tungsten, erbium, ytterbium, platinum and vanadium silicide forming metals. Nickel and cobalt silicide forming metals are particularly common. Others of the above enumerated silicide forming metals are less common. Typically, the silicide layers 32 are formed using a salicide method. The salicide method includes: (1) forming a blanket silicide forming metal layer upon the semiconductor structure of FIG. 8; (2) thermally annealing the blanket silicide forming metal layer with silicon surfaces which it contacts to selectively form the silicide layers 32 while leaving unreacted metal silicide forming metal layers on, for example, the spacers 30 and the isolation regions 16; and (3) selectively stripping unreacted portions of the silicide forming metal layers from, for example, the spacers 30 and the isolation regions 16. Typically, the silicide layers 32 comprise a nickel silicide material or a cobalt silicide material that has a thickness from about 10 to about 80 nanometers.

Figure 10:
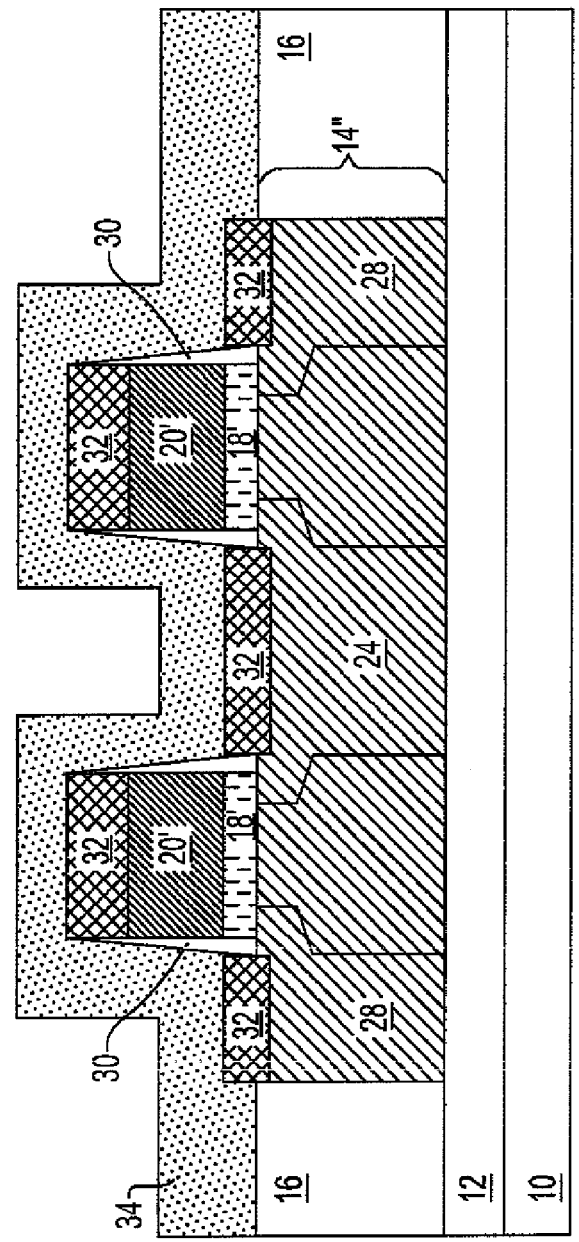

FIG. 10 shows a stressed liner layer 34 located and formed upon the semiconductor structure of FIG. 9. The stressed liner layer 34 is typically used as a liner in conjunction with a field effect transistor fabricated simultaneously with the gated diode structure whose schematic cross-sectional diagram is illustrated in FIG. 10. The stressed liner layer 34 may comprise any of several stressed liner materials. Such stressed liner materials may include, but are not necessarily limited to, silicon oxide materials, silicon nitride materials, silicon oxynitride materials and silicon carbide materials. Such stressed liner materials may be compressive stressed liner materials (i.e., having a stress in excess of −0.3 GPa and useful within the context of pFETs) or tensile stressed liner materials (i.e., having a stress in excess of 0.3 GPa and useful within the context of nFETs). While the instant embodiment is particularly intended as including an n field effect transistor that includes a tensile stressed liner 34 located and formed upon the gated diode structure within the semiconductor structure of FIG. 10, neither the instant embodiment nor the invention is necessarily so limited. Rather, the embodiment contemplates use of either a compressive or tensile stressed liner 34.

Figure 11:
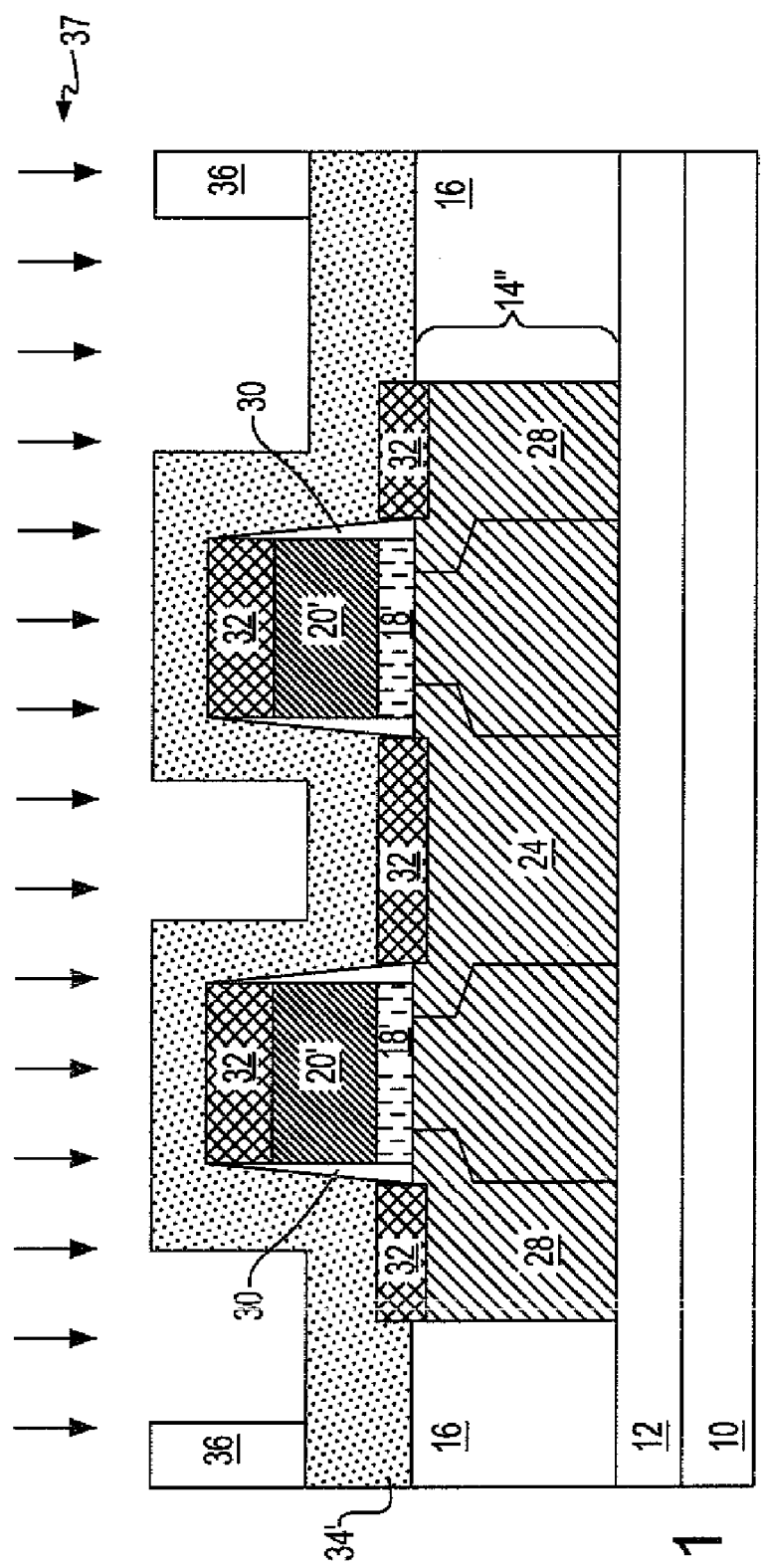

FIG. 11 first shows a fourth mask 36 located and formed covering a portion of the stressed liner layer 34 that is peripheral to the gated diode structure that is located and formed within the surface semiconductor layer 14". The fourth mask 36 may comprise materials, have generally analogous dimensions, and be formed using methods, analogous, equivalent or identical to the third mask 26, the second mask 23 or the first mask 22.

FIG. 11 also shows the results implanting the stressed liner 34 that is illustrated in FIG. 10 to provide a relaxed liner 34' while using a dose of stress relaxing ions 37. Within FIG. 11, a relaxed portion of the relaxed liner 34' covers the gated diode structure that includes the surface semiconductor layer 14", and an unrelaxed portion (i.e., still stressed portion) of the relaxed liner layer 34' is located beneath the fourth mask 36. The transition between the relaxed portion and the unrelaxed portion is uninterrupted, i.e. contiguous, and also conformal to the underlying gate and silicon substrate.

The dose of stress relaxing ions 37 is typically provided at an ion implantation dose from about 1e14 to about 5e15 stress relaxing ions per square centimeter and an ion implantation energy from about 5 to about 80 keV, to provide a stress relaxing atom concentration within the relaxed liner 34' from about 5e15 to about 1e17 stress relaxing atoms per cubic centimeter. The foregoing dose and energy depend upon the ion species. The most critical aspect in choice of dose and energy is that the ions do not penetrate the stress film into the underlying semiconductor materials or silicon materials. Particularly desirable stress relaxing ions are silicon, germanium and xenon implanting ions, as well as other stress relaxing ions that have a mass greater than about 28 amu, or more particularly greater than about 70.

While this particular embodiment distinctly illustrates and particularly contemplates that an ion implantation method may be used for stress relaxation within a portion of the stressed liner layer 34 that is illustrated in FIG. 10 when forming the relaxed liner layer 34' that is illustrated in FIG. 11, neither the embodiment, nor the invention, is necessarily intended to be so limited. Rather, the embodiment and the invention contemplate that treatments other than an ion implantation treatments may be used for stress relaxation or stress elimination within a portion of a stressed liner layer. Such other treatment methods may include, but are not necessarily limited to, radiation treatments, such as but not limited to ultraviolet radiation treatments or chemical treatments such as a partial etch or thinning of a layer.

FIG. 12A and FIG. 12B show a schematic cross-sectional diagram and a schematic plan-view diagram of the semiconductor structure of FIG. 11, including the gated diode structure, after having stripped therefrom the fourth mask 36. The fourth mask 36 may be stripped using methods and materials analogous, equivalent or identical to the methods and materials used for stripping the third mask 26, the second mask 23 or the first mask 22.

FIG. 12B illustrates in particular only the isolation region 16, the surface semiconductor layer 14" and the gate 20', in order to clearly show the annular gated diode structure in accordance with the particular embodiment and the invention.

FIG. 13A and FIG. 13B correspond generally with FIG. 12A and FIG. 12B, but illustrate a dielectric passivation layer 38 covering the semiconductor structure including the gated diode structure. Penetrating through the passivation layer 38 is a plurality of vias 40.

The passivation layer 38 may comprise any of several passivation materials. Included in particular are silicon oxide, silicon nitride and silicon oxynitride passivation materials. The passivation layer 38 may be formed using methods including but not limited to chemical vapor deposition methods and physical vapor deposition methods. Typically, the passivation layer 38 has a thickness from about 50 to about 300 nanometers.

The vias 40 may comprise any of several conductor materials, including but not limited to metal, metal alloy, metal silicide and metal nitride via materials. Such via materials may be formed using methods that are otherwise generally conventional in the semiconductor fabrication art.

FIG. 12A and FIG. 12B in particular illustrate a schematic cross-sectional and schematic plan-view diagram of a gated diode structure in accordance with a preferred embodiment of the invention. The gated diode structure includes a relaxed liner 34' located and formed covering a gate 20' and adjacent anode and cathode diode electrodes 24 and 28 within the gated diode structure. The relaxed liner 34' derives from a stressed liner 34 that is typically used within the context of a field effect transistor that is fabricated simultaneously with the gated diode structure. The relaxed liner 34' is formed from the stressed liner 34 by virtue of a treatment, such as but not limited to an ion implantation treatment. The relaxed liner 34' is desirable in comparison with a stressed liner 34, particularly when tensile stressed, insofar as the relaxed liner provides for improved gated diode ideality while avoiding any gated diode ideality degradation that might otherwise result from stripping the stressed liner 34 from the gated diode structure while using a reactive ion etch method.

The preferred embodiment is illustrative of the invention rather than limiting of the invention. Revisions and modifications may be made to methods, materials, structures and dimensions of a gated diode structure in accordance with the preferred embodiment while still providing a gated diode in accordance with the invention, and a method for fabricating a gated diode structure.

What is claimed is:

1. A gated diode structure comprising:
   a semiconductor substrate including at least two comparatively lightly doped regions of a first polarity, wherein each of the at least two comparatively lightly doped regions is present between and laterally separating a comparatively heavily doped region of the first polarity from a comparatively heavily doped region of a second polarity different than the first polarity, wherein said each of the at least two comparatively lightly doped regions is in direct contact with said comparatively heavily doped region of said first polarity and said comparatively heavily doped region of said second polarity, wherein the comparatively heavily doped region of the second polarity is present between the at least two comparatively lightly doped regions;
   a gate located above each of the at least two comparatively lightly doped regions of the first polarity; and
   a relaxed liner located conformally covering the gate and the semiconductor substrate.

2. The gated diode structure of claim 1 wherein the semiconductor substrate comprises a bulk semiconductor substrate.

3. The gated diode structure of claim 1 wherein the semiconductor substrate comprises a semiconductor-on-insulator substrate.

4. The gated diode structure of claim 1 wherein the first polarity is an n polarity and the second polarity is a p polarity.

5. The gated diode structure of claim 1 wherein the first polarity is a p polarity and the second polarity is an n polarity.

6. The gated diode structure of claim 1 wherein the gate is included within a gate stack that includes a gate dielectric interposed between the gate and the semiconductor substrate.

7. The diode structure of claim 1 wherein the relaxed liner layer comprises a silicon nitride material.

8. A gated diode structure comprising:
a semiconductor substrate including at least two comparatively lightly doped regions of a first polarity, wherein each of the at least two comparatively lightly doped regions is present between and laterally separating a comparatively heavily doped region of the first polarity from a comparatively heavily doped region of a second polarity different than the first polarity, wherein said each of the at least two comparatively lightly doped regions is in direct contact with said comparatively heavily doped region of said first polarity and said comparatively heavily doped region of said second polarity, wherein the comparatively heavily doped region of the second polarity is present between the at least two comparatively lightly doped regions;
a gate located above each of the at least two comparatively lightly doped regions of the first polarity; and
a liner located conformally covering the gate and the semiconductor substrate, the liner including a silicon nitride material that includes an impurity selected from the group consisting of germanium impurities and xenon impurities, the liner also including:
a relaxed portion covering at least in-part the gate; and
a stressed portion covering at least in part the semiconductor substrate.

9. The gated diode structure of claim 8 wherein the relaxed liner includes a germanium impurity only.

10. The gated diode structure of claim 8 wherein the relaxed liner includes a xenon impurity only.

11. The gated diode structure of claim 8 wherein the semiconductor substrate comprises a bulk semiconductor substrate.

12. The gated diode structure of claim 8 wherein the semiconductor substrate comprises a semiconductor-on-insulator substrate.

13. The gated diode structure of claim 8 wherein the gate is included within a gate stack that includes a gate dielectric interposed between the gate and the semiconductor substrate.

14. A method for fabricating a gated diode structure comprising:
forming over a semiconductor substrate at least two gate structures;
forming within the semiconductor substrate at least two comparatively lightly doped region of a first polarity located beneath the at least two gate structures and laterally separating a comparatively heavily doped region of the first polarity from a comparatively heavily doped region of a second polarity different than the first polarity, wherein each of the at least two comparatively light doped regions is in direct contact with said comparatively heavily doped region of said first polarity and said comparatively heavily doped region of said second polarity wherein the comparatively heavily doped region of the second polarity present between the at least two comparatively lightly doped regions;
forming a stressed liner conformally covering the gate and the semiconductor substrate; and
treating the stressed liner to form a relaxed liner.

15. The method of claim 14 wherein forming the comparatively heavily doped region of the first polarity and the comparatively heavily doped region of the second polarity different than the first polarity each use at least in part the gate as a mask.

16. The method of claim 14 wherein the treating uses an ion implantation method.

17. The method of claim 14 wherein the treating uses an ultraviolet illumination.

18. The method of claim 16 wherein the ion implantation method uses a germanium stress relaxing ion.

19. The method of claim 16 wherein the ion implantation method uses a xenon stress relaxing ion.

20. The method of claim 16 wherein the ion implantation method uses a stress relaxing ion having a mass greater than about 70 amu.

* * * * *